United States Patent [19]
Mason et al.

[11] Patent Number: 5,946,219
[45] Date of Patent: Aug. 31, 1999

[54] METHOD AND SYSTEM FOR CONFIGURING AN ARRAY OF LOGIC DEVICES

[75] Inventors: Martin T. Mason, San Jose; Scott C. Evans, Santa Clara; Sandeep S. Aranake, Sunnyvale, all of Calif.

[73] Assignee: Atmel Corporation, San Jose, Calif.

[21] Appl. No.: 08/739,606

[22] Filed: Oct. 30, 1996

[51] Int. Cl.⁶ .................................................. G06F 17/50
[52] U.S. Cl. ........................................... 364/489; 364/488
[58] Field of Search .................................... 364/488, 489, 364/490, 491

[56] References Cited

U.S. PATENT DOCUMENTS

| | | | |
|---|---|---|---|
| 4,745,084 | 5/1988 | Rowson et al. ............................ | 437/51 |
| 4,845,633 | 7/1989 | Furtek ..................................... | 364/490 |
| 4,896,272 | 1/1990 | Kurosawa ............................... | 364/491 |
| 4,967,367 | 10/1990 | Piednoir ................................. | 364/489 |
| 4,970,664 | 11/1990 | Kaiser et al. . | |
| 5,036,473 | 7/1991 | Butts et al. . | |
| 5,089,973 | 2/1992 | Furtek . | |
| 5,208,768 | 5/1993 | Simoudis ............................... | 364/578 |
| 5,349,691 | 9/1994 | Harrison et al. . | |
| 5,361,373 | 11/1994 | Gilson .................................... | 395/800 |
| 5,394,031 | 2/1995 | Britton et al. . | |
| 5,448,493 | 9/1995 | Topolewski et al. ................... | 364/489 |
| 5,463,563 | 10/1995 | Bair et al. .............................. | 364/490 |
| 5,491,640 | 2/1996 | Sharma et al. ......................... | 364/488 |
| 5,499,192 | 3/1996 | Knapp et al. ........................... | 364/489 |
| 5,528,176 | 6/1996 | Kean . | |
| 5,544,067 | 8/1996 | Rostoker et al. . | |
| 5,555,201 | 9/1996 | Dangelo et al. . | |
| 5,594,657 | 1/1997 | Cantone et al. ........................ | 364/490 |
| 5,623,418 | 4/1997 | Rostoker et al. . | |
| 5,673,198 | 9/1997 | Lawman et al. ....................... | 364/489 |

OTHER PUBLICATIONS

"Field Programmable Gate Array," ATMEL Configurable Logic Data Data Book, Aug. 1995, pp. 2–21 through 2–38.
Joel Rosenberg, "Implementing Cache Logic with FPGAs," ATMEL Configurable Logic Data Book, Aug. 1995, pp. 7–11 through 7–15.
"Controlling FPGA Configuration with a Flash–Based Microcontroller," ATMEL Microcontroller Data Book, Oct. 1995, pp. 4–21 through 4–27.
"Field Programmable Gate Arrays," Xilinx, Jun. 1996, pp. 4–253 through 4–272.
Overview of Design Environment for Xilinx FPGA, Xilinx, pp. 7–1 through 7–7.

*Primary Examiner*—Kevin J. Teska
*Assistant Examiner*—Leigh Marie Garbowski
*Attorney, Agent, or Firm*—Thomas Schneck; George B.F. Yee

[57] ABSTRACT

A system and method for partial reconfiguration of a gate array includes generating a netlist by placement and routing of a logic circuit. The netlist is accessed to modify logic cells configurations created by the place and route operation. Based on the modifications, a partial configuration bitstream containing only bitstrings which implement the modified logic cells is created. The partial configuration bitstream is downloaded to the gate array, thereby effectuating a partial reconfiguration of the gate array. In an alternate embodiment, a system in accordance with the present invention includes software utilities which allow an application program executing in a system containing a programmable gate array to reconfigure the array on-the-fly. The utilities include routines for modifying the design in response to external conditions detected during run-time. This approach obviates the need for providing a set of predetermined alternate designs, allowing the application to make that determination on its own.

21 Claims, 13 Drawing Sheets

Logical Constants Configuration Information:

| Instance Name | Location | Existing Conf | New Conf |
|---|---|---|---|
| C0_0..C0_7 | (7,10)..(14,10) | 10101011 | 11111010 |
| C1_0..C1_7 | (7,12)..(14,12) | 01011011 | 01011010 |
| C2_0..C2_7 | (7,14)..(14,14) | 10101011 | 11011110 |
| C3_0..C3_7 | (7,16)..(14,16) | 11101111 | 01110110 |
| C4_0..C4_7 | (7,18)..(14,18) | 10100011 | 11001110 |
| C5_0..C5_7 | (7,19)..(14,19) | 10101011 | 01110110 |
| C6_0..C6_7 | (7,20)..(14,20) | 01101011 | 11011110 |
| C7_0..C7_7 | (7,21)..(14,21) | 10101111 | 11111010 |

HELP  CANCEL  OK

FIG. 8A

Logical Constants Configuration Information:

| Instance Name | Location | Existing Conf | New Conf |
|---|---|---|---|
| C0_0..C0_7 | (7,10)..(14,10) | 10101011 | 11111010 |
| C1_0..C1_7 | (7,12)..(14,12) | 01011011 | 01011010 |
| C2_0..C2_7 | (7,14)..(14,14) | 10101011 | 11011110 |
| C3_0..C3_7 | (7,16)..(14,16) | 11101111 | 01110110 |
| C4_0..C7_0 | (7,18)..(7,21) | 1101 | 1011 |
| C4_1..C7_1 | (8,18)..(8,21) | 0010 | 1111 |
| C4_2..C7_2 | (9,18)..(9,21) | 1111 | 0101 |
| C4_3..C7_3 | (10,18)..(10,21) | 0000 | 0111 |
| C4_4..C7_4 | (11,18)..(11,21) | 0111 | 1011 |
| C4_5..C7_5 | (12,18)..(12,21) | 0001 | 1110 |
| C4_6..C7_6 | (13,18)..(13,21) | 1111 | 1111 |
| C4_7..C7_7 | (14,18)..(14,21) | 1111 | 0000 |

HELP    CANCEL    OK

FIG. 8B

FULL ADDER

| A | B | $C_{in}$ | Sum | $C_{out}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

FULL SUBTRACTER

| A | B | $B_{in}$ | Sub | $B_{out}$ |
|---|---|---|---|---|
| 0 | 0 | 0 | 0 | 0 |
| 0 | 0 | 1 | 1 | 1 |
| 0 | 1 | 0 | 1 | 1 |
| 0 | 1 | 1 | 0 | 1 |
| 1 | 0 | 0 | 1 | 0 |
| 1 | 0 | 1 | 0 | 0 |
| 1 | 1 | 0 | 0 | 0 |
| 1 | 1 | 1 | 1 | 1 |

METHOD AND SYSTEM FOR CONFIGURING AN ARRAY OF LOGIC DEVICES

TECHNICAL FIELD

The present invention relates generally to programmable logic devices, and more particularly to the configuration of field programmable gate arrays.

BACKGROUND ART

In the early days of integrated circuit technology, logic circuits, such as shift registers, multiplexers, adders and so on, were constructed from digital IC's. These small scale integration (SSI) IC's usually contained a small number (e.g. four–eight) of logic gates such as AND gates, OR gates, flip-flops, latches and such, requiring a few dozen or so transistors. As the technology advanced, increasing numbers of transistors could be incorporated into an IC. Today, semiconductor manufacturers are able to fit millions of transistors onto a single die, resulting in highly sophisticated chips such as the modern microprocessor.

Equally sophisticated are the systems into which these VLSI (very large scale integration) and ULSI (ultra-large scale integration) chips are incorporated. Such systems usually employ a number of custom logic chips to provide a variety of supporting logic functions. Gate arrays were developed which permitted manufacturers to quickly implement a customer's logic design. These devices consisted of an array of logic gates manufactured using standard methods. Customization of the devices took place during the final steps of manufacture wherein a metallization layer connected the logic gates to implement the desired logic function.

These gate arrays evolved into programmable devices, providing greater flexibility for the designer who may require only a small number of the devices, or who has not fully developed the logic design but may require small samples for testing. Another type of programmable logic device employs fuses to provide interconnections among the logic gates in the devices. The fuses were blown to break a connection, or in the case of so-called anti-fuses connections were formed. Such devices, therefore, could be used only once, storing only one set of logic functions.

Continued evolution of programmable logic devices has resulted in the development of re-programmable interconnects, and more importantly the development of configurable logic cells. As the name implies, a configurable logic cell permits a designer to program the cell to function as any one of a number of basic logic gates or higher level logic functions. Current manufacturing technology makes possible the production of high density devices having many thousands of configurable logic cells and their associated interconnects, known as field programmable gate arrays (FPGA's). The availability of these high density devices enables the designer to employ increasingly complex logic functions. Like their predecessors, FPGA's include programmable interconnects. Moreover, the interconnects are reprogrammable, further increasing the utility of FPGA's.

Reconfiguring these reprogrammable FPGA's, however, has typically required that the entire device be reconfigured. A further evolutionary step of these devices is represented in an FPGA manufactured by Atmel Corp., assignee of the present invention. Known as dynamically reconfigurable FPGA's, these devices allow only selected portions of the logic array to be reconfigured. In this way changes can be made to an FPGA without having to program the entire device, permitting only the selected portions of the array to be reconfigured.

Referring to FIG. 1, a typical FPGA 100 includes a plurality of configurable logic cells 130, configurable I/O blocks 110, and configurable inter- connects 120, 122, collectively referred to as resources of the FPGA. Although the interconnects 120, 122 are shown as a grid of individual interconnect lines, each "line" in actuality is a set of interconnect lines, as shown in FIG. 3B for instance. Each logic cell 130 and I/O block 110 includes data lines 140, 142 which can be selectively coupled to the interconnects 120, 122.

A typical design cycle begins with the design of one or more logic circuits which will then be implemented in an FPGA. A logic design includes logic gates and interconnections among the logic gates. Certain designs, however, such as digital filters incorporate the use of "constants," namely strings of ones and zeroes, to define their behavior. For the purposes of the description of the present invention, such constants are regarded as being part of the design and also will be referred to as logic gates.

For example, FIG. 2 shows a simple logic design. Each element in the logic design is identified by an instance name. Thus, the AND gates and the OR gate in FIG. 2 are named, G1–G3. FIG. 3A shows how the logic design might appear in the FPGA 100'. Each of the gates G1–G3 and the interconnections shown in FIG. 2 is mapped to selected logic cells and interconnects as shown in FIG. 3A. Similarly, the inputs A–D and the output OUT (FIG. 2) are mapped to selected I/O blocks. Thus, interconnects 120a–120c and 122a–122c (shown high-lighted) connect together logic cells G1–G3 and I/O blocks 110a–110e. A magnified portion of the configuration of FIG. 3A is shown in FIG. 3B, illustrating the specific interconnections among the various logic cells, interconnects, and I/O blocks. Although the design in the figures do not show the use of constants, it is known that logic cells in a modern FPGA can be configured to output a logic "1" or a logic "0" and that groups of logic cells can be so configured to produce one or more strings of ones and zeroes as needed.

The steps for transferring the design of FIG. 2 to an FPGA, such as the one shown in FIG. 3A, will now be explained. Since most of today's designs tend to be quite complex in functionality, a computer-aided design (CAD) tool usually is employed to facilitate the design process. Thus in FIG. 4, the design flow 200 begins with entering the initial design for a logic circuit, step 210, as for example through the use of a CAD tool.

Next, is the placement and routing of the logic gates of the logic circuit, step 212. As a result of the placement and routing step, a design database is generated, step 214. The design database specifies those logic cells, I/O blocks, and interconnects (i.e. resources) of the FPGA which will participate in the implementation of the logic circuit, including locations of selected resources and their routing or logic configurations. FIG. 1 illustrates one of a number of coordinate systems used to identify the location of logic cells. In the convention shown in FIG. 1, the cells are numbered in left to right order and from bottom to top, beginning with the lower leftmost cell (0,0) and ending with the upper rightmost cell (3,3). Typically, the design database additionally includes the instance names which were assigned to the elements of the logic circuit during the design phase, FIG. 2.

From the information contained in the design database, a configuration bitstream is generated by a tool commonly referred to as a bitstream compiler, step 216. The bitstream compiler takes the location and configuration information stored in the design database and creates the defining bitstrings which will configure the various resources within the FPGA. At the physical level, the defining bitstrings represent the ON/OFF state of the transistors (switches) within the FPGA which actually control the configuration of each logic cell and I/O block, and the interconnections among the logic cells and the I/O blocks.

At this point, the configuration bitstream either may be downloaded to the logic array thereby configuring the device, step 218*a*, or the bitstream may be saved onto disk, step 218*b*. These alternatives are indicated in FIG. 4 by dashed lines.

As occasionally happens, it may be desirous to make changes to the initial design, even though the design has been debugged and operates as intended. For example, new requirements may result in changes to the functional specification which might necessitate changes to the initial design. Using conventional prior art techniques, a modification to a final version of the initial design, step 220, leads to a repeat of the previous steps. Thus, the designer accesses the final version of the initial design using a CAD tool and makes the desired changes to the design. A second placement and routing step is performed, step 222, from which a second design database is generated, step 224. A second configuration bitstream is then created by the bitstream compiler based on the new design database, step 226.

As with the first configuration bitstream, the second configuration bitstream may or may not be downloaded to the FPGA. If a download is desired, two choices are available: The bitstream can be downloaded to the FPGA in its entirety, thereby reconfiguring the entire array to contain the modified design. Alternatively where the FPGA is dynamically reconfigurable, meaning that the device is capable of being partially reconfigured, only those portions of the second configuration bitstream which correspond to the changes in the design can be downloaded. This is accomplished first by determining the differences between the first and second configuration bitstreams, step 228, to produce a partial (reconfiguration) bitstream. The partial bitstream then is downloaded to the dynamically reconfigurable FPGA, step 230, thereby effectuating a partial reconfiguration of the FPGA in which only those logic cells, interconnects, and I/O's involved in the modified design are reprogrammed. Finally, the cycle can be repeated for additional modifications to the design, step 232, as changes in the functional requirement of the design occur.

Placement and routing of the logic gates in a design is a computationally intensive activity. As designers tend toward increasingly complex designs due to the availability of high density FPGA's, the placement and routing operation could significantly increase. Under the prior art approach outlined in FIG. 4, the amount of time dedicated to placement and routing computations can reach alarming levels considering that each iteration of the design cycle may require a full placement and routing operation.

Another aspect of the prior art approach is the possibility that a modified design will result in a placement and routing configuration that is different from the previous design. This becomes a concern if the previous design had been fine tuned to provide certain critical timing behavior. A subsequent design that is processed through a full placement and routing operation might result in a different placement of logic gates with different net lengths, thus adversely affecting the timing of the circuit. This is an unacceptable circumstance where real-time applications are involved.

What is needed is a methodology which improves upon the prior art with respect to the turn-around time for the redesign of fully completed and debugged logic designs. It is also desirable to have a development methodology whereby portions of a prior design which are not involved in a design modification remain unaffected.

Up to this point, the discussion has centered around the design of logic circuits in the environment of the designer's engineering lab. It is observed, however, field applications of FPGA's may not be suitable to a single static design. Although FPGA's can be reconfigured in the field under actual operating conditions, the new configurations typically consist of complete designs stored in non-volatile devices such as EPROM. Configuration bitstreams are read from the EPROM and downloaded into the FPGA. Thus, the suite of available configurations is limited to the storage capacity of the EPROM. In applications such as adaptive filtering, it is highly desirable that the filter response be alterable at run time based on criteria such as the frequency and phase characteristics of the data being filtered, i.e. conditions that usually are unpredictable. In such cases, it is not possible to specify new configurations, such as filter parameters, a priori.

What is also needed then is the ability to configure an FPGA on-the-fly, in response to the environment in which the device is operating. In addition, since only portions of the FPGA need to be reconfigured, as in the case of an adaptive filter, it is desirable to have on-the-fly partial reconfiguration capability.

SUMMARY OF THE INVENTION

In accordance with the present invention, a method for configuring a dynamically reconfigurable FPGA begins with entering an initial logic design. Placement and routing is performed on the design resulting in the assignment of locations to the logic cells and interconnects within the FPGA which will implement the design. A design database is the result of the placement and routing operation. Next, a bitstream compiler which operates on the design database generates a configuration bitstream. The bitstream can either be downloaded to the FPGA thus configuring the device, or the bitstream can simply be saved onto a storage medium.

Changes to a final working version of the initial design are made based on the corresponding design database. The modified design database is saved, and a second configuration bitstream is generated from the modified design database. In accordance with the invention, the second configuration bitstream consists only of defining bitstrings for those logic cells, I/O blocks, and interconnects which correspond to the modified logic design. This second bitstream is referred to as a partial configuration bitstream.

By directly accessing the design database to implement a change in the design, the time consuming placement and routing computations that would otherwise be required are entirely avoided. This is an especially useful and desirable feature when a final working version of the logic design must be modified, for example, due to a change in the functional requirements of a system that incorporates the FPGA. Quite often, design changes are incremental in nature, involving only a very localized part of the overall design. Other times, a designer may want to experiment with variations of the final working version of the logic design. The configuration methodology of the present invention ensures a very short turn-around time for implementing design changes, so that incremental changes and "what-if" experiments are feasible and expedient so as not to adversely impact project development and product release schedules. Moreover, since the placement and routing operation is bypassed, any timing critical portions of the design which have not been modified by the designer will be unaffected and will be guaranteed to deliver known timing performance. More generally, any portion of the design that has not been modified will continue to behave as expected. Thus with the method of the present invention, the resulting FPGA application is guaranteed to be correct by construction and hence functionally correct.

In a preferred embodiment of the present invention, the design database is presented to the user through a graphical interface. The interface allows the user to specify portions of the design database for display. A design database identifies logic cells, I/O blocks, and interconnects by their instance names and locations in the FPGA. The user is presented with names, locations, and current configurations of the logic cells, including those which are configured to output a constant logical value. Interconnections among the logic cells are also represented.

Modifications to the design database are made by selecting from a list or menu of logic gates and interconnect options, represented graphically or textually. Modifications to constants are made textually by entering the new constant values, or graphically by manipulating iconic representations of one or more switches which can be opened (logic "0") or closed (logic "1").

In another embodiment of the present invention, a system for real-time reconfiguration of an FPGA includes a hardware interface to the device and software utilities to access the device for the purpose of downloading new configuration data. The software utilities include means for generating partial configuration bitstreams, allowing an applications program to configure the FPGA in response to certain conditions in the operating environment detected during runtime. The hardware interface and software utilities permit access to the FPGA while the device is in use, allowing portions of the device to be reconfigured.

BRIEF DESCRIPTION OF THE DRAWINGS

FIGS. 8A and 8B are sample screenshots of the user interface of the present invention.

BEST MODE OF CARRYING OUT THE INVENTION

Figure 5:
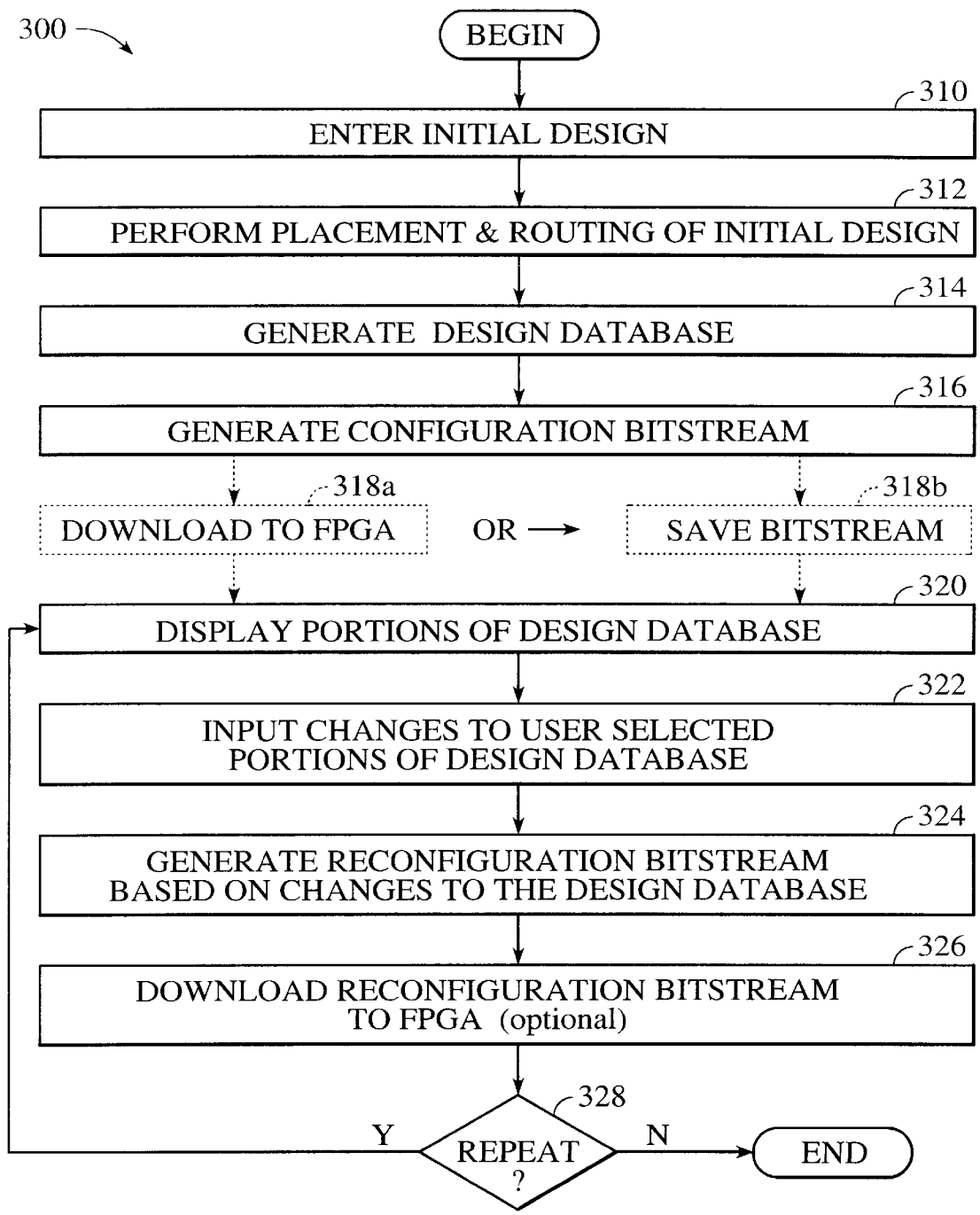
FIG. 5 outlines one embodiment of the design methodology of the present invention.

With reference to FIG. 5, the configuration methodology 300 in accordance with one embodiment of the present invention includes creating an initial design, step 310, and performing a placement and routing operation to obtain a first design database, steps 312 and 314. A bitstream compiler then creates the configuration bitstream, step 316, which can be downloaded to an FPGA to configure the device, step 318a. Alternatively, the configuration bitstream can simply stored onto a storage device, step 318b. The configuration bitstream includes a plurality of defining bitstrings which specify how the resources in the FPGA are going to be configured.

When a change to the final working version of the initial logic design is needed, modifications to the design are made directly to the design database. Continuing then with the method 300 outlined in FIG. 5, portions of the design database are displayed to the designer, step 320. The designer selects those portions of the design database which need to be modified and inputs the changes, step 322. Based on the modifications entered, a partial configuration bitstream (also referred to as a reconfiguration bitstream) is generated, consisting only of the defining bitstrings which correspond to the modifications. This partial bitstream can then be downloaded, step 326, or saved to a storage medium.

Figure 6:
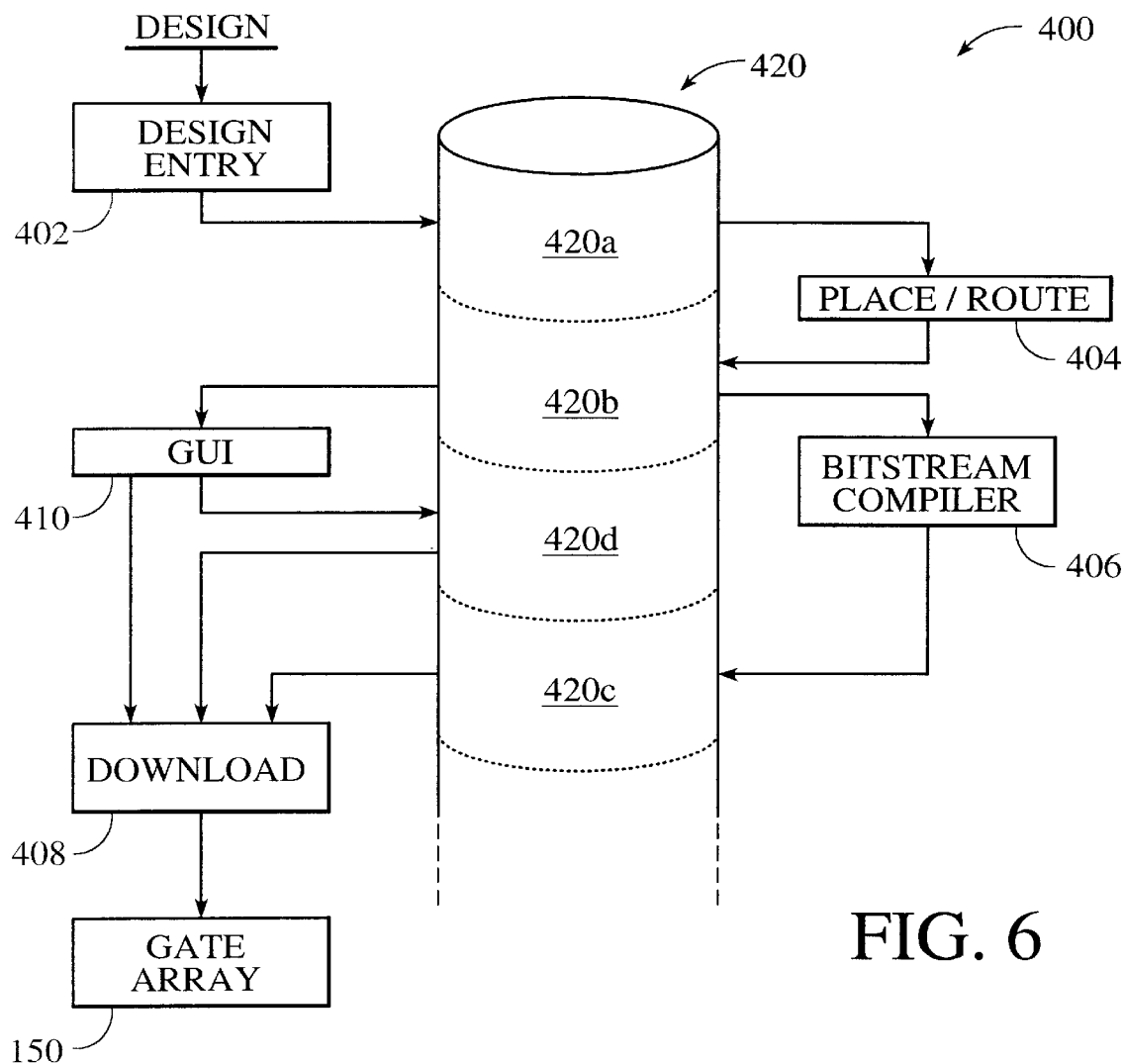
FIG. 6 is a block diagram of a system for configuring FPGA's in accordance with the present invention.

A system for configuring a dynamically configurable FPGA, which embodies the method outlined in FIG. 5 is shown in FIG. 6. The system 400 includes a data store 420 and various modules 402–420. A design-entry module 402, such as a CAD tool, a schematic capture program, or the like is used to create, and to store onto the disk 420, the initial design 420a. A place-and-route module 404 takes the initial design 420a and creates the design database 420b, which is also stored on the disk. A bitstream compiler 406 generates the configuration bitstream 420c, and a download module 408 downloads the configuration bitstream to the FPGA 150.

Modifications to a final working version of the initial logic design are entered by the designer through a graphical user interface (GUI) module 410. The GUI reads in the design database 420b and displays portions of the design database selected by the designer. The GUI accepts modifications to the design database and creates a partial bitstream based solely on the modifications entered. The GUI incorporates the functionality of the bitstream compiler to generate the partial bitstream. The partial bitstream 420d is then stored on the disk and subsequently downloaded to the FPGA through the download module 408. Alternatively, the GUI can communicate the partial bitstream directly to the download module 408. It should be noted at this point that alternative storage media can be used to store the configuration (and reconfiguration) bitstream if immediate downloading to the FPGA is not required. For example, it may be desirable to download the configuration (and reconfiguration) bitstream to an EEPROM or the like for subsequent distribution.

Figure 7C:
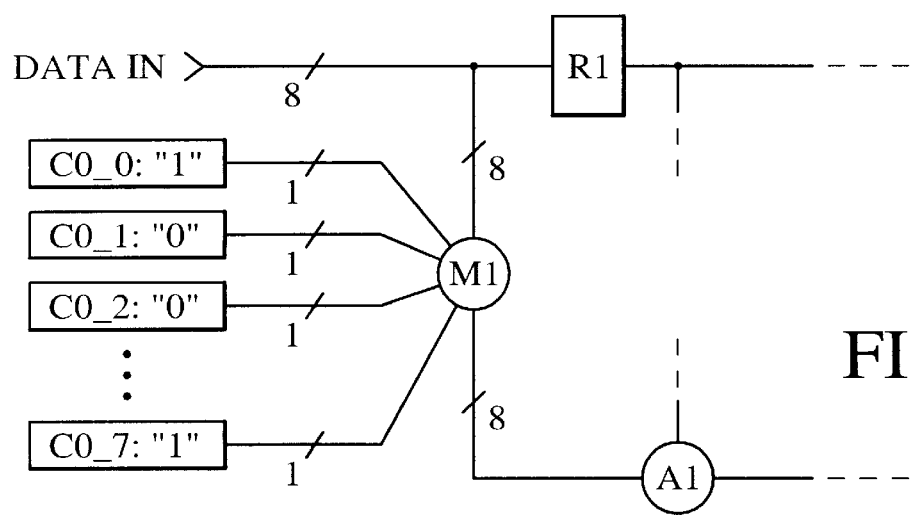
FIGS. 7A–7C illustrate a digital filter design.
Figure 7A:
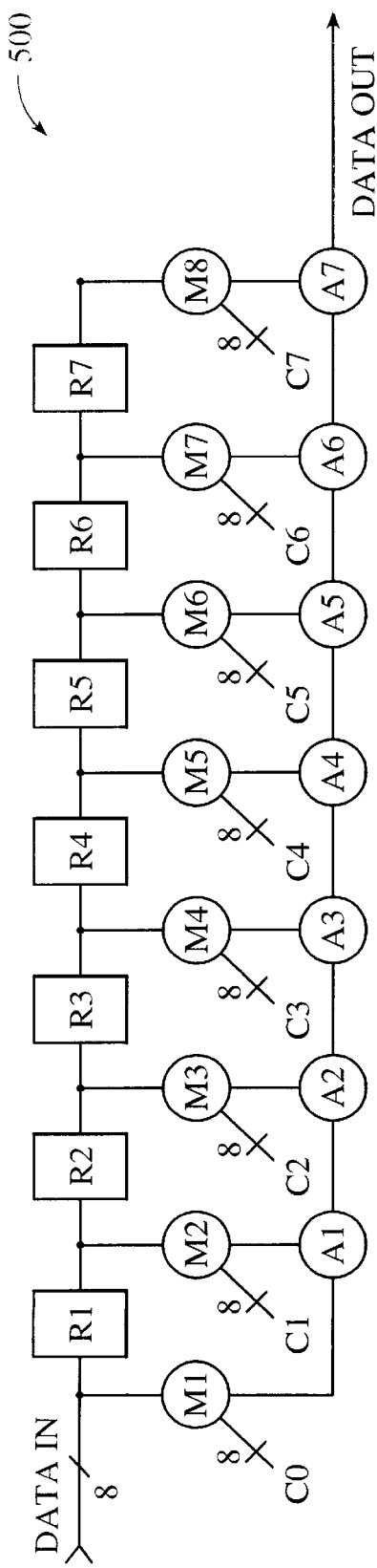

To illustrate the methodology outlined in FIG. 6, consider an adaptive digital filter such as one shown in FIG. 7A. The filter design 500 consists of delay registers R1–R7, multipliers M1–M8, and adders A1–A7 cascaded in series. The data width is eight bits (one byte). A set of filter coefficients $C_0$–$C_7$ serves as multiplicands for the multiplication operators. As each byte of data is shifted in and propagated through the registers, the multipliers form product terms between the coefficients and the data. The product terms are then summed by the adders A1–A7.

Recall that each of the elements in a logic design, such as the filter design 500, has an instance name originally assigned by the designer. Thus, with reference to FIG. 7A, the registers are named R1–R7, the multipliers are named M1–M8, and the adders have instance names A1–A7. Instance names have also been assigned to the coefficients $C_0$–$C_7$. Specifically, each of the bits comprising the coefficients has a name. This is illustrated more clearly in the expanded view for coefficient $C_0$ shown in FIG. 7C. The coefficient is an eight bit quantity wherein the bits are named C0_0 through C0_7. Returning to FIG. 7A, it is understood that the interconnections among the elements R1–R7, M1–M8, and A1–A7 also are named. However, the instance names for these interconnects have been omitted to avoid cluttering the diagram.

Figure 1:
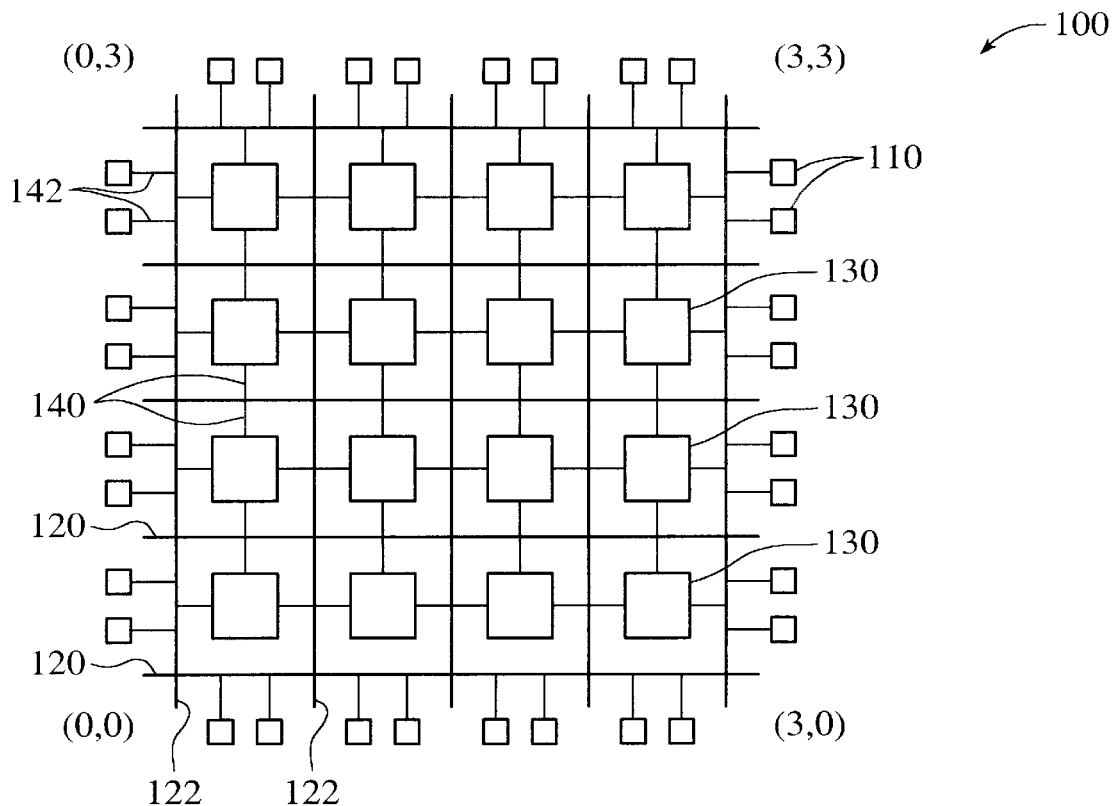
FIG. 1 shows the construction of a typical FPGA.
Figure 2:
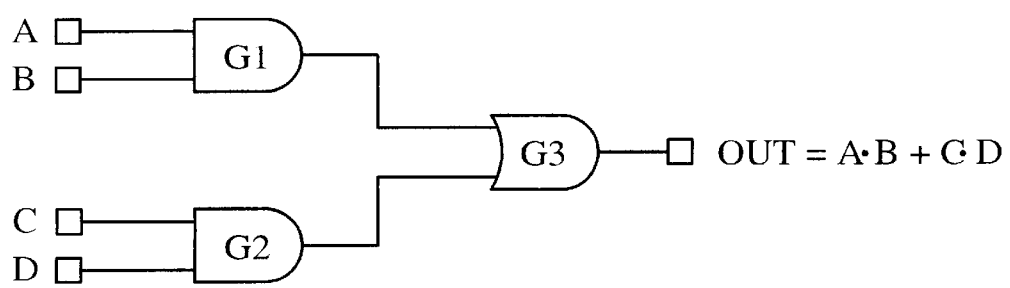
FIG. 2 is an example logic circuit.
Figure 3A:
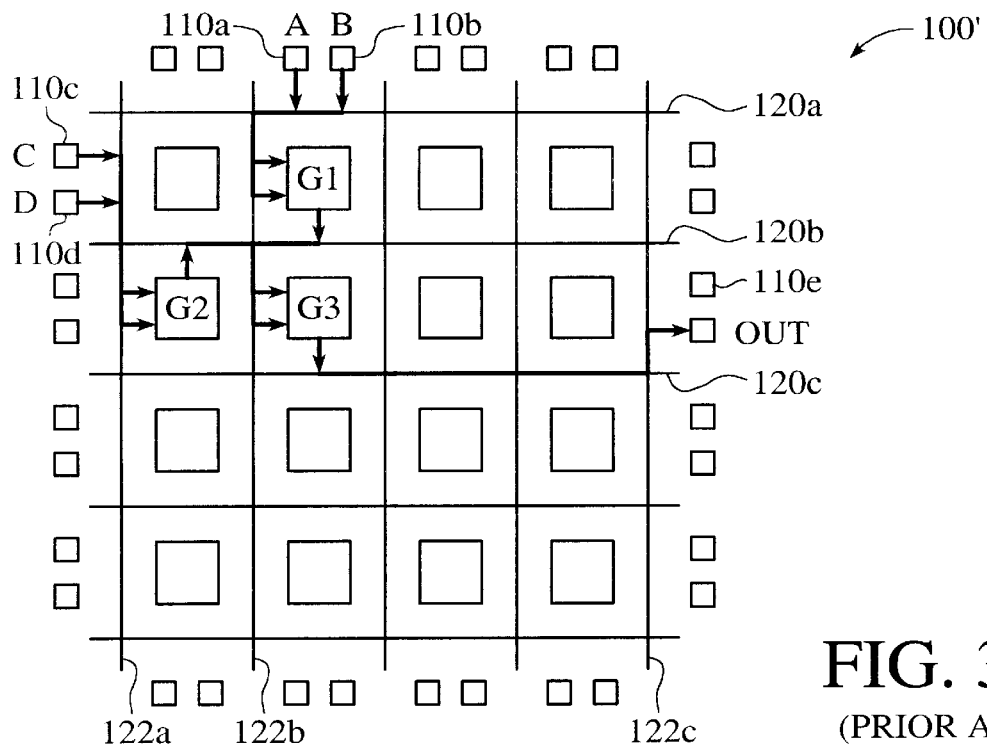
FIGS. 3A and 3B illustrate an implementation of the logic circuit of FIG. 2 in the FPGA of FIG. 1.
Figure 3B:
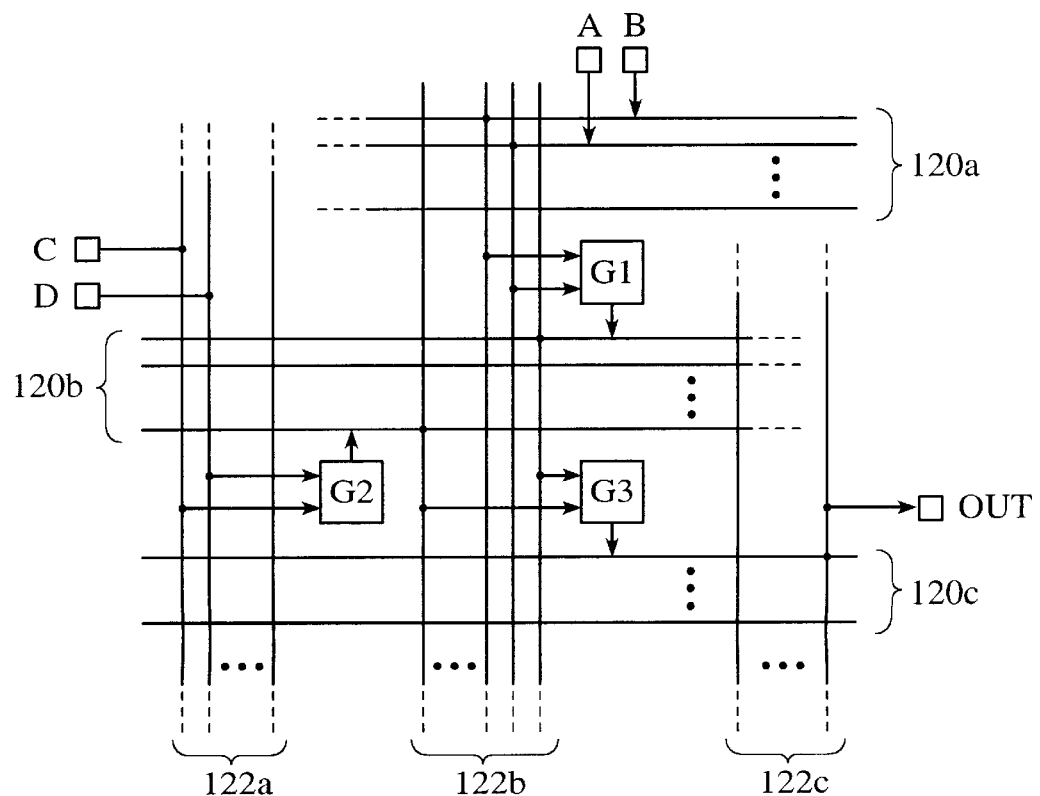

Placement and routing of the filter design 500 results in a design database, specifying by instance name, each of the registers and arithmetic operators, and the locations and configurations of the logic cells selected to implement these functions. In like manner, the design database lists each of the instance names of the bits comprising the coefficients $C_0$–$C_7$, the locations of their corresponding logic cells, and whether the logic cell is configured to produce a logic "0" or a logic "1". The logic cells appearing in the design database are identified through a coordinate system within the FPGA, such as the one shown in FIG. 1.

Figure 7B:
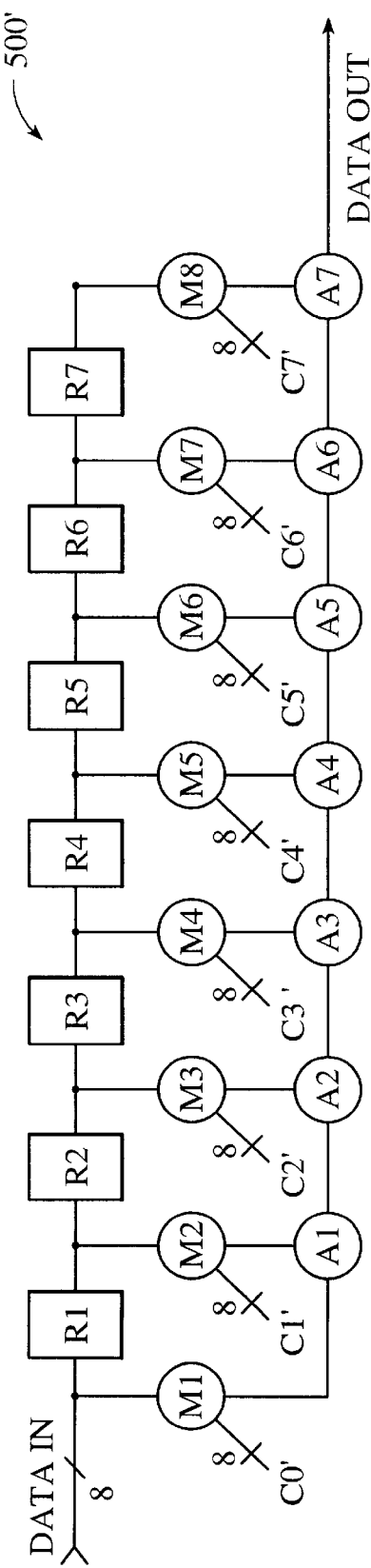

FIG. 7B shows a modified design 500' of the digital filter of FIG. 7A, whereby a different set of coefficients $C'_0$–$C'_7$ has been specified. A designer desiring to make such modifications in accordance with the method of the present invention, begins by accessing the first design database that was created based on the initial design 500. This is best achieved using a graphical user interface (GUI), although a text-based interface can be just as effective though perhaps more difficult and less efficient to use.

In one embodiment, the GUI has a mode for editing the logical constants defined in a logic design. For example, the screenshot of FIG. 8A displays each of the constants $C_0$–$C_7$ in the design 500. Under the column INSTANCE NAME are the names of the bits which comprise each of the coefficients $C_0$–$C_7$. Each bit is implemented by a logic cell that is configured to output a constant logic level. Recall that each logic cell has a corresponding instance name. Where cells are identified by a range, as in the case in FIG. 8A, the instance names of the first and last cells in the range are displayed. Under the LOCATION column is the location within the FPGA of the corresponding logic cell. Suppose for explanatory purposes that the coordinate numbering convention being used follows the convention shown in FIG. 1. Thus, according to FIG. 8A, the logic cells comprising the coefficient $C_0$ are located in columns 7–14 of row 10 in the FPGA; the cells for coefficient $C_1$ are located in columns 7–14 of row 12; and so on. The EXISTING CONF column displays the current logic value being generated by the logic cell. For example, the eight logic cells in columns 7, 8, 9, 10, 11, 12, 13, and 14 which comprise coefficient $C_0$ are shown to be currently configured to output logic "1", "0", "1", "0", "1", "0", "1", and "1" respectively. The NEW CONF column consists of input fields, allowing the user to enter new logic values as a string of bits. Each bit in the string corresponds in one-to-one relation with the constant cells represented by the string.

Since the design database contains all of the information needed to produce the display shown in FIG. 8A, the GUI simply searches through the design database, identifying those logic cells which have been configured to produce a constant logic level and accesses their instance names, cell locations, and current configuration information. Specific software implementation details for accessing the design database and producing displays such as the one in FIG. 8A will vary depending upon the precise data structures used for any given design database format. Such implementation details are well within the scope and capabilities of computer programmers of ordinary skill.

The logical constants shown in FIG. 8A are grouped with preference to horizontal adjacency. In a given block of constant logic cells, the cells can be grouped as sets of horizontal cells or as vertical cells. For example, in FIG. 8A, it can be seen that cell locations (7, 18) through (14, 21) define a block of 32 logic cells. These cells are displayed as four groups of eight horizontally adjacent cells. Thus, the four horizontal groups are: (7, 18) through (14, 18); (7, 19) through (14, 19); (7, 20) through (14, 20); and (7, 21) through (14, 21).

Alternatively, the cells in the block (7, 18) through (14, 21) can be grouped with preference to vertical adjacency. This is shown in the screenshot of FIG. 8B. In this case, there are eight vertical groups of four cells each: (7, 18) through (7, 21); (8, 18) through (8, 21); (9, 18) through (9, 21); (10, 18) through (10, 21); (11, 18) through (11, 21); (12, 18) through (12, 21); (13, 18) through (13, 21); and (14, 18) through (14, 21). The other fields for these cells are modified accordingly to reflect the vertical grouping.

In accordance with the preferred embodiment, groups of adjacent constant cells will be represented as a range of cells. Since, the cells which make up coefficients $C_0$–$C_3$ exhibit only horizontal adjacency, they are displayed as horizontal groups. Likewise, cells which exhibit only vertical adjacency would be grouped vertically. Where constant cells can be grouped vertically or horizontally, the grouping is made in accordance with a user specified preference. Thus, coefficients $C_4$–$C_7$ can be grouped horizontally or vertically as shown in FIGS. 8A and 8B, depending upon the designer's preference. In the example shown in the figures, the preference might be for horizontal adjacency as shown in FIG. 8A. However, in another design, the coefficients may be laid out in a vertical fashion, in which case the vertical preference of FIG. 8B would be selected.

In another embodiment of the invention, non-contiguous constant cells may be grouped together. The GUI allows the user to select an arbitrary set of constant cells and to treat the selected cells a group. Though the cells are non-contiguous, the GUI displays the cells as a group and allows the user to modify the logic values of the cells as a group. Thus, a string of bit values representing the new logic values entered by the user would be mapped in one-to-one correspondence to the constant cells in the group, much in the same way as explained above in connection with FIGS. 8A and 8B.

Figure 4:
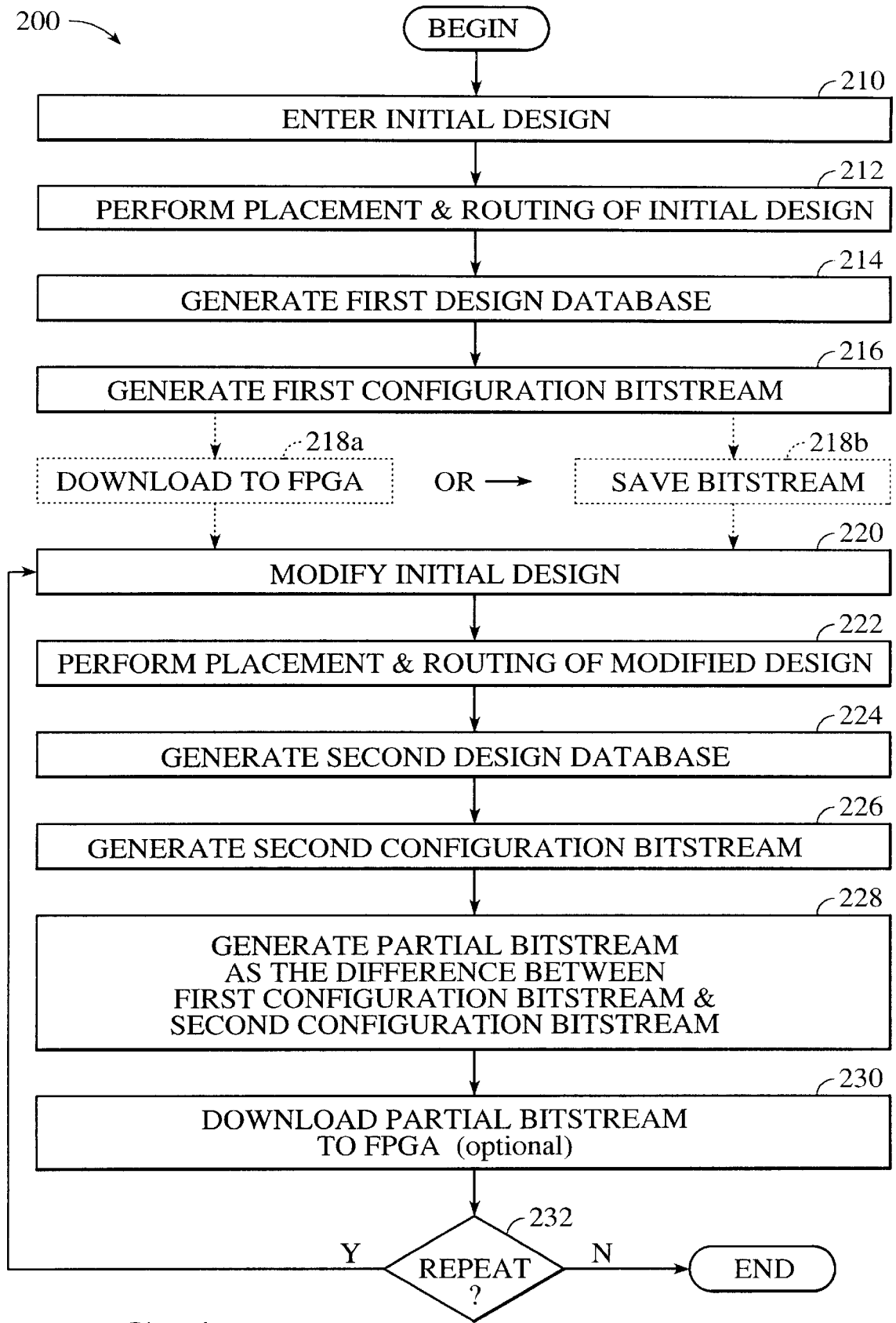
FIG. 4 is an outline of the steps conventionally employed in the design of FPGA's.

Having entered the new coefficient values $C_0'$–$C_7'$, the GUI produces a partial configuration bitstream in accordance with step 324 of FIG. 5. Since the GUI is in possession of both the cell locations (obtained from the design database) and their new configurations (obtained from the designer), the GUI is able to produce a configuration bitstream that will effectuate the design changes specified by the designer. The partial configuration bitstream is based solely on the changes input by the designer and includes configuration information only for those cells in the FPGA which participate in the design change. There is no need to perform a placement and routing operation on the entire design to derive the changes in the configuration bitstream, as would be the case with prior art methods, see FIG. 4. Instead, the GUI proceeds directly from the user's input to the partial configuration bitstream. This approach significantly reduces the time needed to implement changes in the design, allowing the designer to quickly implement and test design alternatives.

Figures 9A, 9B:
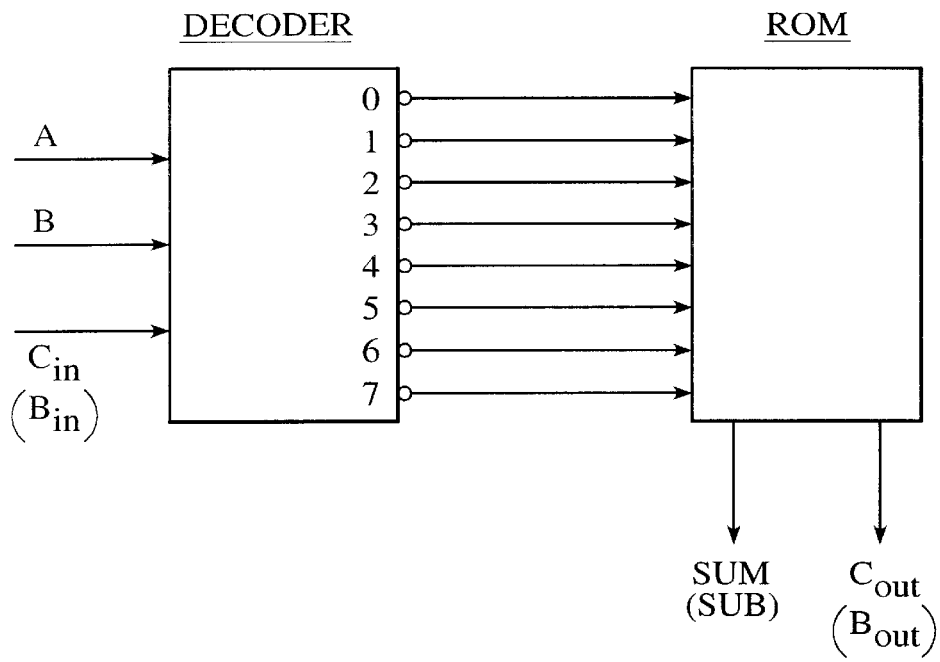
FIGS. 9A–9D show implementations of an adder circuit and a subtracter circuit using a ROM-based look-up table.
Figure 9C:
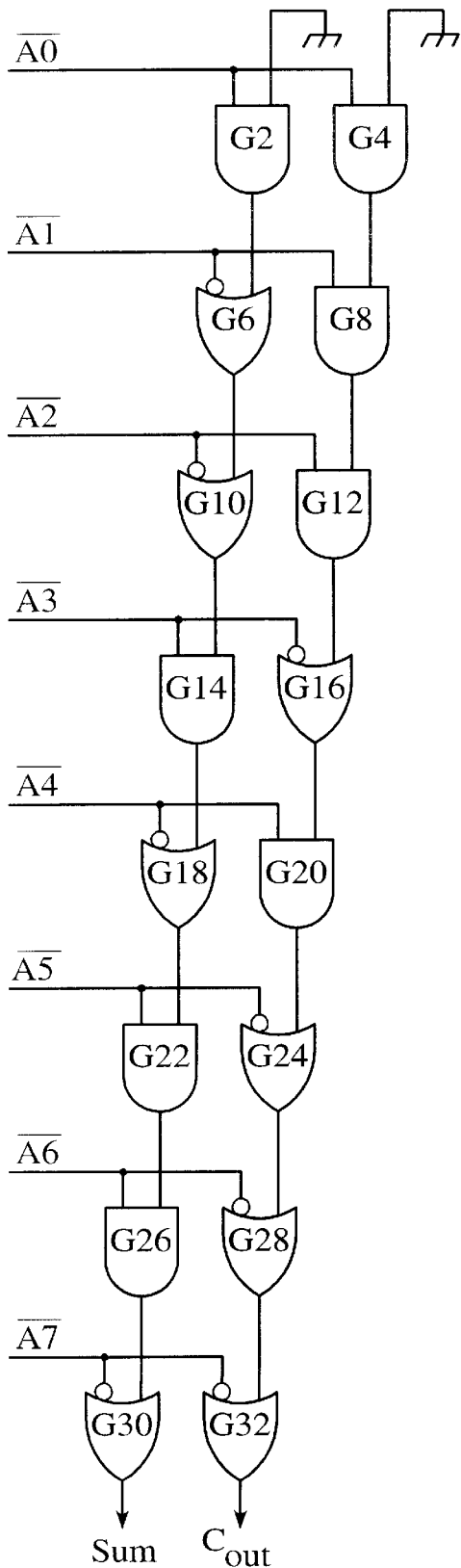
Figure 9D:
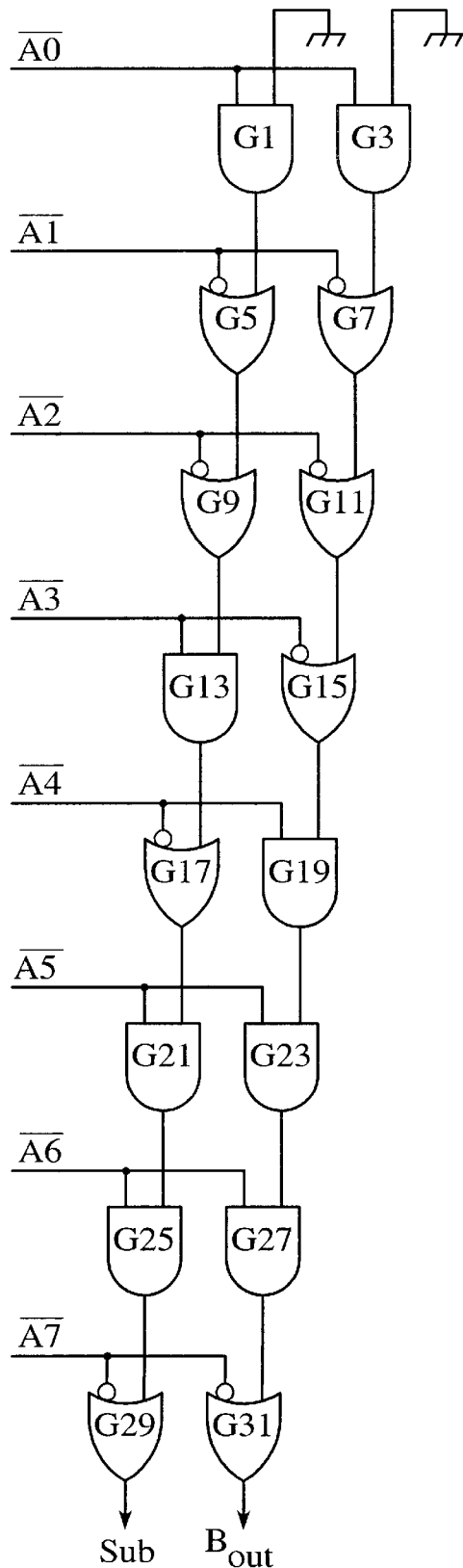

The GUI of the preferred embodiment further includes a mode for modifying logic cells configured as logic gates. Consider, for example, the ROM-based look-up table shown in FIG. 9A, consisting of a ROM array and a decoder. Look-up tables are typically used as function generators to implement logical functions such as a full adder and a full subtracter, whose truth tables are shown in FIG. 9B. An implementation of an adder and of a subtracter are shown in FIGS. 9C and 9D respectively, where the eight outputs (0–7) of the decoder in FIG. 9A are shown in FIGS. 9C and 9D as A0–A7. It can be seen that the adder circuit differs from the subtracter in four places: AND gates G8, G12 of the adder are replaced by OR gates G7, G11 in the subtracter; and OR gates G24, G28 of the adder are replaced by AND gates G23, G27 in the subtracter.

Figure 10A:
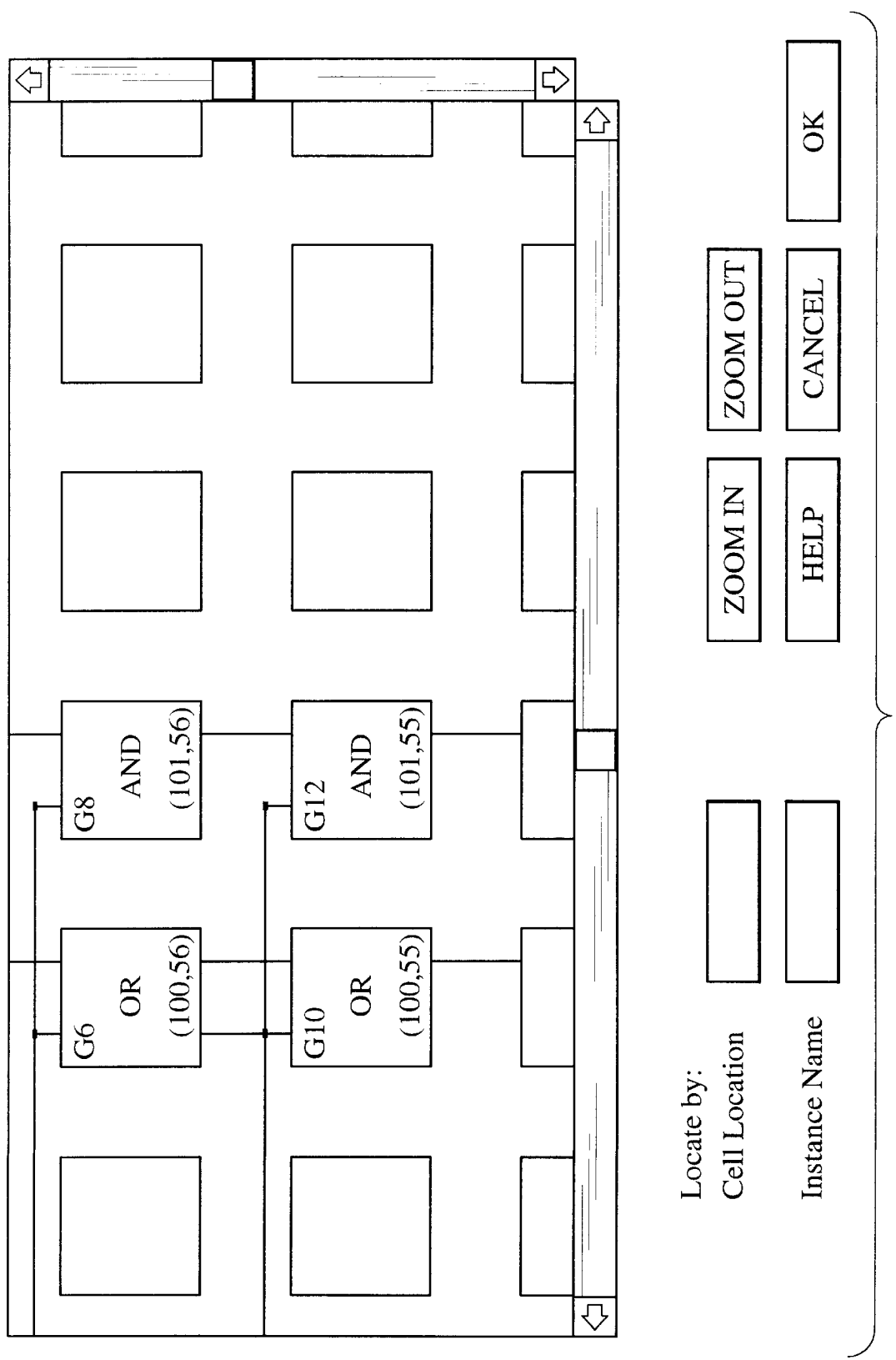
FIGS. 10A–10B show sample screenshots of the user interface of the present invention.
Figure 10B:
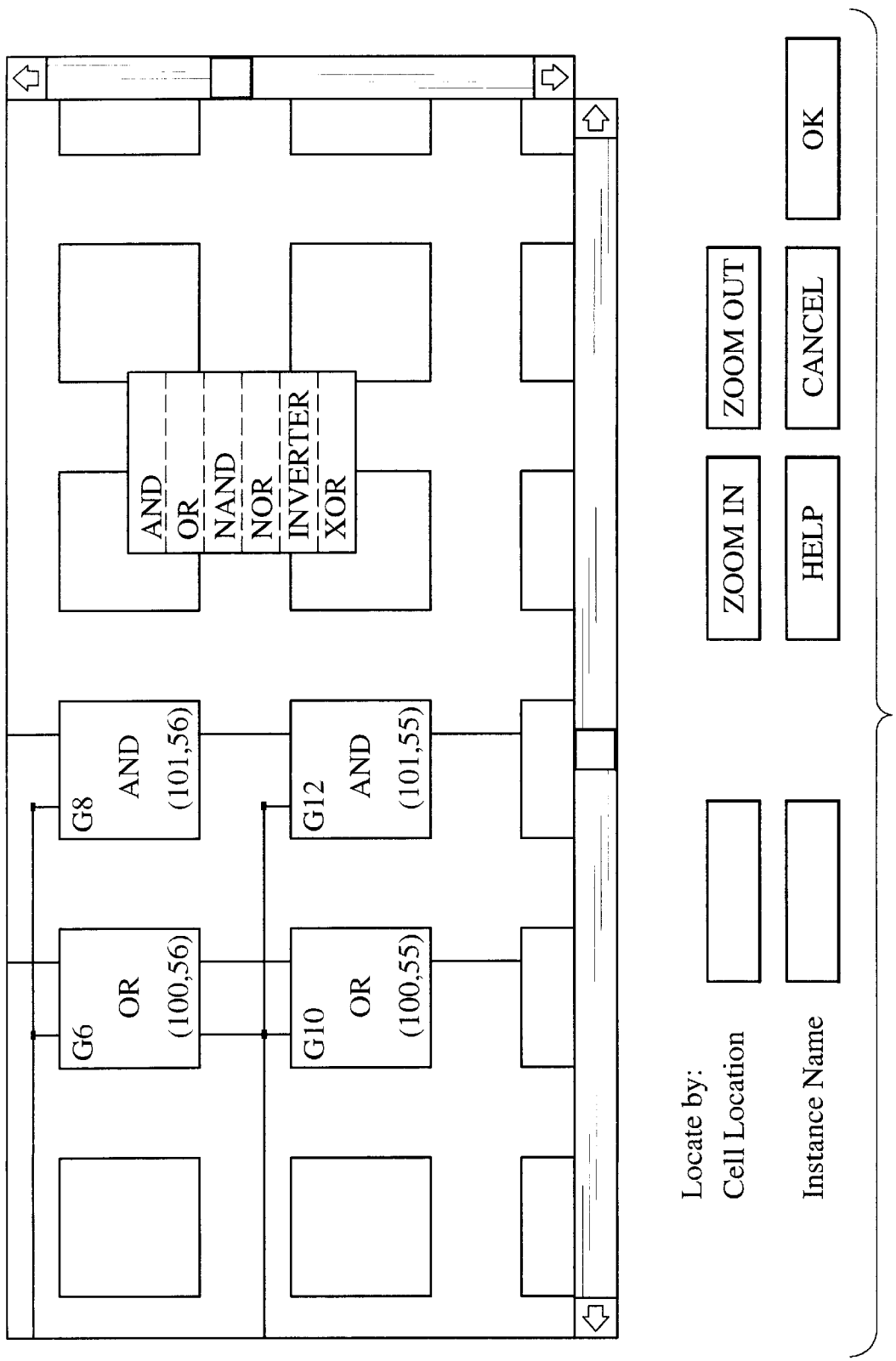

Using the method of the present invention, the designer can easily switch from one circuit to another simply by locating or otherwise identifying the four gates of interest and changing the configurations of their corresponding logic cells. With reference to FIGS. 10A and 10B, the GUI can display, in a window, the logic design as it is laid out in the FPGA. By scrolling the window, any portion of the array can be brought into view within the window. Alternatively, the GUI can locate portions of the array by entering the appropriate information in the cell location field or the instance name field shown in FIG. 10A.

Assume for the following discussion that the initial logic design incorporates the adder circuit in FIG. 9C, and that conversion to the subtracter circuit in FIG. 9D is desired. The GUI accesses the design database resulting from a place and route operation performed on the initial design for the adder circuit and displays the layout of the design in terms of the elements of the FPGA. The display may consist of iconic or other graphical representations of the logic cells making up the FPGA. Alternatively, the GUI may display icons representing the logic function provided by each logic cell. Yet another alternative is to provide a textual representation of the composition of the FPGA, although this approach is not as efficient in conveying information about, or navigating within, the FPGA as the graphical approach.

The designer displays the portions of the adder circuit to be changed, either by scrolling or by specifying the instance name of the gates. The screenshot in FIG. 10A shows a portion of the design database centered about a part of the adder circuit, namely gates G6, G8, G10, and G12. It can be seen that OR gate G6 has been assigned to a logic cell in row 56, column 100, AND gate G8 has been assigned to a logic cell in row 56, column 101, and so on. To change gate G8 from an AND gate to an OR gate, the designer first selects the gate, such as by placing a mouse cursor on the icon for the gate and pressing a mouse button. FIG. 10B shows gate G8 being highlighted to indicate that it has been selected. A click of another mouse button (or a key press) produces a pop-up menu, showing a list of possible logic gates. Selecting the OR entry from the menu causes the selected gate G8 to be configured as an OR gate. Gate G12 is changed in the same manner. Next, the designer brings into view gates G24 and G28, such as by scrolling the window. The gates G24 and G28 then are modified in the manner as described above.

When the modifications are complete, the OK button is pressed. As outlined in the method shown in FIG. 5, the GUI generates a partial configuration bitstream based solely on the modifications. The resulting bitstream consists only of the bitstrings needed to redefine the four cells of the original design (G8, G12, G24, and G28 of the adder circuit) to behave as gates G7, G11, G23, and G27 of the subtracter. Thus, by directly accessing the design database for the initial full adder design and making changes thereto, the design engineer can avoid time consuming steps of a full place and routing operation.

As a final note, it is observed that the particular gate selection and menu methods discussed above are not critical to the practice of the present invention. Other graphically based input/selection methods would be equally effective.

With respect to look-up tables in general, such as the ones shown in FIG. 9B, the logic function implemented by a look-up table is fully defined by the outputs of the table. Thus, the SUM and $C_{out}$ columns in FIG. 9B fully define a full adder function, and the SUB and $B_{out}$ columns fully define a full subtracter function. The GUI need not display the specific logic cells which implement a particular look-up table, but rather can list only the table outputs and allow the user to enter changes to the table outputs. The GUI will then specify the required logic cells to implement the new look-up table. Representing the look-up table at a higher level of abstraction in this manner presents the table in a more meaningful way to the user, hiding the less meaningful implementation details from the user, and is therefore of greater utility.

From FIGS. 9C and 9D, it can be seen that a look-up table can be implemented by a cascaded series connection of 2-input AND gates and 2-input OR gates. For example, the SUM outputs of the full adder are implemented by gates G2, G6, G10, G14, G18, G22, G26, and G30, while the $C_{out}$ outputs are implemented by gates G4, G8, G12, G16, G20, G24, G28, and G32. Thus, the GUI can easily reconfigure a look-up table which defines a first function to implement a second function simply by changing the appropriate gates which implement the table.

Figure 11:
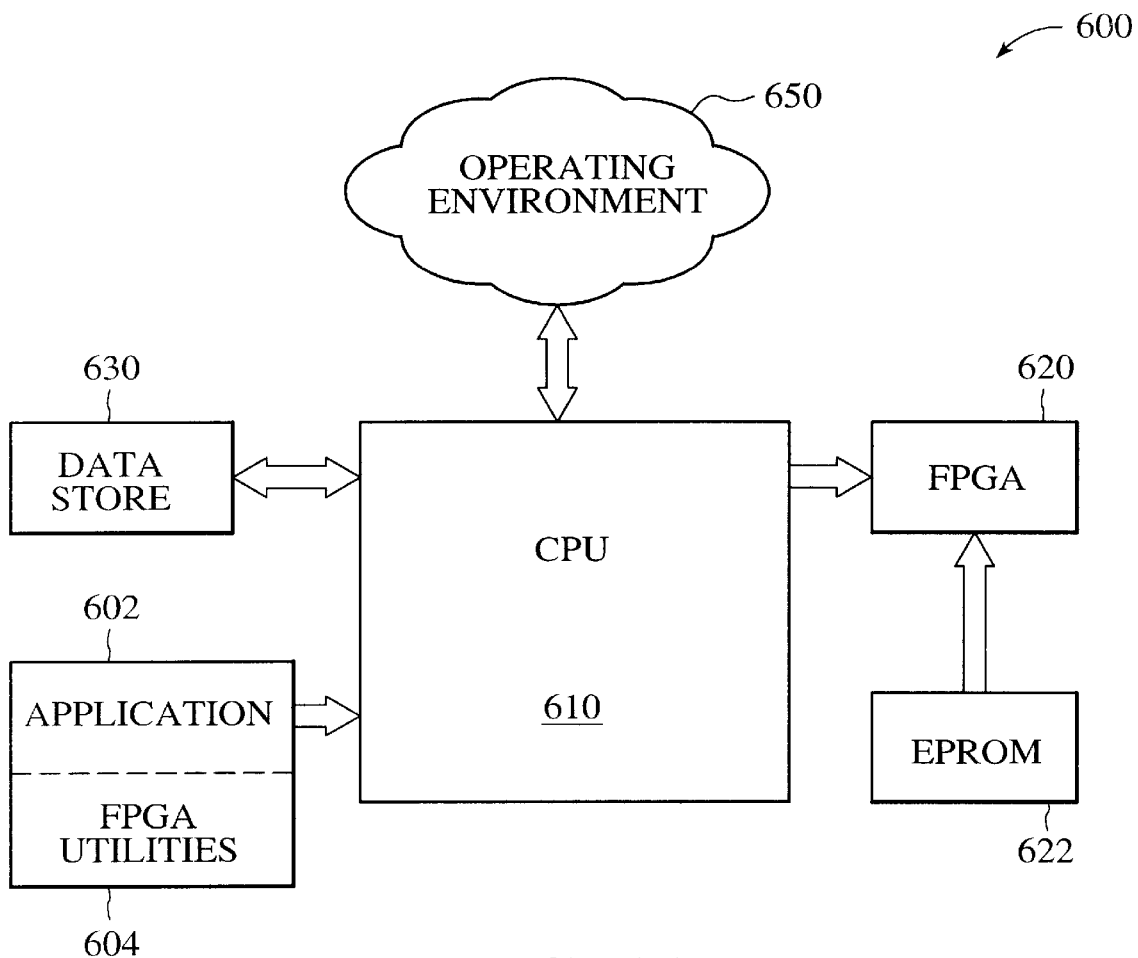
FIG. 11 shows a system for real-time FPGA reconfiguration.

The discussion will now turn to another embodiment of the present invention which allows a designer to reconfigure a dynamically reconfigurable FPGA in real-time, i.e. an array which is incorporated into a system that is operating at the time of the reconfiguration. Referring to FIG. 11, a typical system 600 includes a CPU or microcontroller 610, an FPGA 620, an EPROM 622 or some other non-volatile RAM device, and a data store 630 such as disk storage. System software running on the CPU 610 includes application specific software 602 and FPGA utilities 604 for configuring the FPGA. At system bootup, the FPGA is loaded with a configuration bitstream that has been programmed into the EPROM 622. Alternatively, the FPGA can be initially configured from a configuration bitstream stored on the data store 630.

During operation of the system 600, the software may detect certain conditions about its operating environment 650. For example, with respect to the digital filter design shown in FIGS. 8A and 8B, the software 602 may determine that the cut-off frequency of the filter needs to be adjusted. In response, previously accumulated data can be analyzed and new coefficients computed based on the analysis. Certain FPGA utilities 604 are then called upon to create a partial configuration bitstream containing the bitstrings for defining the new coefficients. Next, the application software 602 calls upon other FPGA utilities to download the partial configuration bitstream to the FPGA, thereby effectuating a change in the design of the filter.

The extent of the design changes made in real time is not limited by the FPGA utilities 604, but rather by the degree of complexity in the specific designs loaded into the FPGA. On-the-fly changes can be restricted by the application software only to changing logical constants or to individual logic gates. Such limitations, however, are application specific; being determined by the availability of computing power, memory, the operating environment and so forth, and are not due to limitations of the present invention.

A set of application programming interfaces (API's) for the FPGA utilities 604 includes:

ConstantCell
  Function:
  Generate a configuration bitstream which configures each logic cell in the specified range to produce either a logic one or a logic zero.
  Parameters:
  xStart—X coordinate of the first logic cell
  yStart—Y coordinate of the first logic cell
  xEnd—X coordinate of the last logic cell
  yEnd—Y coordinate of the last logic cell
  value_string—the corresponding string of 1's and 0's
  buf—pointer to a memory store for storing the configuration bitstring
  Return:
  the number of bytes in the bitstream Return:
  the number of bits in the bitstream
ReadCell
  Function:
  Return the current configuration for the specified logic cell.
  Parameters:
  x_coord—X coordinate location of the logic cell
  y_coord—Y coordinate location of the logic cell
  buf—pointer to a memory store for storing the cell configuration
  Return:
  n/a The following C-language code fragment illustrates how these utilities are used in a typical application. The example is directed to the digital filter in FIG. 8A, showing how the coefficients $C_0$–$C_7$ are adjusted in response to the external operating environment.

```
:
:
:
/* ... a determination has been made that the filter needs adjustment ... */
:
:
/* read the current values of filter coefficients C0 - C7 */
for( i = 0; i < 8; ++i ) /* each coefficient */
        for( j = 0, j < 8; ++j )/* each bit */
                ReadCell(xloc_coeff[i][j], yloc_coeff[i][j], current_buf[i] + j)
/* derive new coefficient values and store in new_buf */
:
:
/* create configuration bitstreams for the new values */
z = 0; /* point to beginning of bstream */
for( i = 0; i < 8; ++i )
{
        z1 = ConstantCell(xloc_coeff[i][0], yloc_coeff[i][0],
             xloc_coeff[i][7], yloc_coeff[i][7], new_buf[i], bstream + z);
        z += z1; /* point to end of bstream */
}
/* download bitstream to FPGA */
DownLoad(bstream);
```

DownLoad
  Function:
  Download a configuration bitstring to the FPGA.
  Parameters:
  buf—pointer to the configuration bitstring to be downloaded
  Return:
  n/a
GateCell
  Function:
  Generate a configuration bitstream which reconfigures a previously defined logic gate to implement a different logic function. Only the logic function of the gate is changed. Other aspects of the gate remain the same, such as the number of input and output terminals.
  Parameters:
  x_coord—X coordinate location of the logic cell
  y_coord—Y coordinate location of the logic cell
  logic—the specific logic function: AND, NAND, OR, NOR, XOR, INVERTER, etc.
  buf—pointer to a memory store for storing the configuration bitstring The system for reconfiguring FPGA's in accordance with the present invention permits reconfiguration of the FPGA in real-time and allows only a portion of the FPGA to be reconfigured. In addition, the present invention allows the application software to determine changes to portions of the design in response to the external operating environment. The advantage of this approach is that the designer does not need to determine a priori all possible alternative designs and their corresponding configuration bitstreams. Rather, the application software can determine design changes, on-the-fly, and create a partial configuration bitstream to implement those changes in response to conditions in the environment as they occur.

We claim:

1. A method of configuring a programmable array of logic cells, said array having a plurality of programmable interconnects, each said logic cell having a unique cell location within said array, said array having a logic design associated therewith, the method comprising:
  accessing a design database representing a configuration of logic cell definitions and interconnections among logic cells corresponding to said logic design;
  presenting portions of said design database to a user;

inputting user specified changes to redefine user selected portions of said design database, including inputting changes to said logic design to change the logical functionality of said logic design;

generating a partial configuration bitstream describing only those of said logic cells and said interconnections associated with said redefined portions of said design database; and downloading said partial configuration bitstream into said array of logic cells, thereby configuring only those portions of said array of logic cells which correspond to said user specified changes.

2. The method of claim 1 wherein said step of generating includes defining said partial configuration bitstream solely on the basis of said redefined portions of said design database.

3. The method of claim 1 wherein said user specified changes include new logic cell definitions or new interconnections, and said step of generating includes defining said partial configuration bitstream solely on the basis of said new logic cell definitions or said new interconnections.

4. The method of claim 1 wherein said step of presenting includes identifying certain logic cells which are configured as logic gates, and for each of said certain logic cells displaying a cell location thereof and displaying a graphical image or a textual representation of its corresponding logic gate.

5. The method of claim 4 wherein said step of inputting user specified changes includes identifying a logic cell to be reconfigured, displaying a list of alternate logic gates and selecting an alternate logic gate from among said list to reconfigure said identified logic cell.

6. The method of claim 5 wherein said step of displaying a list of alternate logic gates includes displaying graphical representations of said alternate logic gates.

7. The method of claim 4 wherein said step of presenting further includes:

identifying fixed-value logic cells in said design database;

for a fixed-value logic cell which is not adjacent to any other fixed-value logic cell, displaying the cell location and the current value of said fixed-value logic cell; and for a group of adjacent fixed-value logic cells, displaying the cell locations of said group as a range of cell locations and displaying the current values of the logic cells in said group as a bitstring.

8. The method of claim 1 wherein said step of presenting includes displaying only those logic cells which are defined to output a constant logic "1" or a constant logic "0."

9. The method of claim 1 wherein said step of presenting includes:

identifying fixed-value logic cells in said design database;

for a fixed-value logic cell which is not adjacent to any other fixed-value logic cell, displaying the cell location and current value of said fixed-value logic cell;

for a group of adjacent fixed-value logic cells, displaying the cell locations of said group as a range of cell locations and displaying the current value of each logic cell in said group collectively as a bitstring.

10. In an FPGA having programmable logic cells and I/O blocks and programmable interconnects disposed between said logic cells and said I/O blocks, a method of generating configuration bitstreams for said FPGA comprising: inputting a logic circuit, said logic circuit including a plurality of logic gates and connections between said logic gates; selecting logic cells and interconnects to implement said logic circuit; forming a design database containing placement and routing information for said selected logic cells and interconnects; generating a first configuration bitstream based on said placement and routing information, said first configuration bitstream containing definitions for all of said selected logic cells and interconnects, thereby implementing said logic circuit; storing said first configuration bitstream in a data store for subsequent downloading into said FPGA; and incorporating changes to the design of said logic circuit; the improvement in the method comprising:

displaying portions of said design database to a user and inputting modifications to selected portions of said design database, including inputting changes to said logic circuit to change the logical functionality thereof; and generating a second configuration bitstream containing new definitions only for those of said logic cells and interconnects which relate to said modifications to said selected portions of said design database.

11. The method of claim 10 further including a step of downloading said first configuration bitstream into said FPGA.

12. The method of claim 11 further including a step of downloading said second configuration bitstream into said FPGA subsequent to said step of downloading said first configuration bitstream.

13. The method of claim 10 wherein said step of generating a second configuration bitstream includes defining a bitstream solely on the basis of the locations and new definitions of said those of said logic cells and interconnects.

14. The method of claim 10 wherein said substep of displaying portions of said design database includes:

identifying a first type of logic cells in said design database which are configured as logic gates;

for each of said first type of logic cells, displaying its cell location and a representation of its corresponding logic gate;

identifying a second type of logic cells in said design database which are configured to produce a constant logic value; and displaying the cell locations and the values of said second type of logic cells.

15. The method of claim 14 wherein said displaying the cell locations and the values of said second type of logic cells includes forming cell groups containing those of said second type of logic cells which are adjacent to each other, and displaying the cell locations of logic cells in each of said cell groups using a range of cell locations.

16. The method of claim 15 wherein said substep of forming cell groups includes forming horizontal groups for those of said second type of logic cells which are horizontally adjacent to others of said second type of logic cells, forming vertical groups for those of said second type of logic cells which are vertically adjacent to others of said second type of logic cells, and if a given logic cell belongs to both a horizontal group and a vertical group, assigning said given logic cell to said horizontal group.

17. The method of claim 15 wherein said substep of forming cell groups includes forming horizontal groups for those of said second type of logic cells which are horizontally adjacent to others of said second type of logic cells, forming vertical groups for those of said second type of logic cells which are vertically adjacent to others of said second type of logic cells, and if a given logic cell belongs to both a horizontal group and a vertical group, assigning said given logic cell to said vertical group.

18. The method of claim 14 wherein said displaying the cell locations and the values of said second type of logic cells includes forming cell groups which include user specified ones of said second type of logic cells, and displaying the cell locations and the logic values of logic cells in each of said cell groups.

19. A system for configuring an FPGA having at least one logical design programmed therein, comprising:

means for detecting conditions external to said FPGA during run-time operation of said FPGA;

means for redesigning a portion of said logical design in response to detection of conditions external to said FPGA;

means for forming a partial configuration bitstream based solely on said redesigned portion;

means for transmitting said partial configuration bitstream to said FPGA, thereby partially reconfiguring said FPGA at run-time to implement said redesigned portion of said logical design.

20. The system of claim 19 further including means for storing at least a portion of a design database representative of said logical design, said means for redesigning including means for accessing said design database, thereby providing a basis for redesigning said logical design.

21. A system for configuring an FPGA having at least one logical constant programmed therein, comprising:

means for detecting conditions external to said FPGA during run-time operation of said FPGA;

means for determining a new value of said logical constant in response to detection of conditions external to said FPGA;

means for forming a partial configuration bitstream based solely on said new value;

means for transmitting said partial configuration bitstream to said FPGA, thereby partially reconfiguring said FPGA at run-time.

* * * * *